US012009943B2

(12) United States Patent
Repp et al.

(10) Patent No.: US 12,009,943 B2
(45) Date of Patent: Jun. 11, 2024

(54) FIELD BUS DRIVER CIRCUIT

(71) Applicant: Infineon Technologies AG, Neubiberg (DE)

(72) Inventors: Jens Repp, Markt Schwaben (DE); Thorsten Hinderer, Neubiberg (DE); Maximilian Mangst, Rott am Inn (DE); Eric Pihet, Munich (DE)

(73) Assignee: Infineon Technologies AG, Neubiberg (DE)

( * ) Notice: Subject to any disclaimer, the term of this patent is extended or adjusted under 35 U.S.C. 154(b) by 466 days.

(21) Appl. No.: 17/468,327

(22) Filed: Sep. 7, 2021

(65) Prior Publication Data

US 2022/0123958 A1 Apr. 21, 2022

(30) Foreign Application Priority Data

Oct. 15, 2020 (DE) .......................... 102020127165.4

(51) Int. Cl.
*H04L 12/40* (2006.01)
*H03K 5/01* (2006.01)
(Continued)

(52) U.S. Cl.
CPC ......... *H04L 12/40006* (2013.01); *H03K 5/01* (2013.01); *H03K 17/6872* (2013.01);
(Continued)

(58) Field of Classification Search
None
See application file for complete search history.

(56) References Cited

U.S. PATENT DOCUMENTS 5,781,585 A * 7/1998 Dorner .................... H04L 43/00
327/64
6,324,044 B1 * 11/2001 Teggatz ................ G06F 13/385
361/119

(Continued)

FOREIGN PATENT DOCUMENTS

| DE | 102017213835 A1 | 2/2019 |
| DE | 102019104115 A1 | 8/2020 |
| JP | 2015019219 A | 1/2015 |

OTHER PUBLICATIONS

Office Action, in the German language, from counterpart German Application No. 102020127165.4, dated Aug. 9, 2021, 7 pp.

*Primary Examiner* — Bob A Phunkulh
(74) *Attorney, Agent, or Firm* — Shumaker & Sieffert, P.A.

(57) ABSTRACT

A transmitter circuit for a field bus driver includes a first bus terminal and a second bus terminal for connecting a first bus line and, respectively, a second bus line. The transmitter circuit further includes a first supply terminal for receiving a supply voltage and second supply terminal for receiving a reference voltage, a first switching circuit coupled between the first supply terminal and the first bus terminal, and a second switching circuit coupled between the second bus terminal and the second supply terminal. The first switching circuit includes a first transistor and a second transistor, and the second switching circuit includes a third transistor and a fourth transistor. Further, the transmitter circuit comprises control circuitry configured to generate first drive signals for the first transistor and the third transistor and second drive signals for the second transistor and the fourth transistor based on a transmit signal.

13 Claims, 10 Drawing Sheets

(51) Int. Cl.
  *H03K 17/687* (2006.01)
  *H03K 5/00* (2006.01)
(52) U.S. Cl.
  CPC .............. *H03K 2005/00013* (2013.01); *H04L 2012/40215* (2013.01)

(56) References Cited

U.S. PATENT DOCUMENTS

| | | | |
|---|---|---|---|
| 10,461,964 B1* | 10/2019 | Cherkassky | H04L 25/0276 |
| 10,673,657 B2* | 6/2020 | Frey | G06F 13/4022 |
| 10,892,759 B1* | 1/2021 | Lee | H04L 12/40 |
| 11,063,561 B1* | 7/2021 | Huang | H04L 12/40 |
| 11,068,429 B2 | 7/2021 | Brando et al. | |
| 2005/0285665 A1* | 12/2005 | Donaldson | H02M 3/07 |
| | | | 327/530 |
| 2006/0091915 A1* | 5/2006 | Pauletti | H04L 25/0284 |
| | | | 327/108 |
| 2011/0199131 A1* | 8/2011 | Boezen | H04L 25/028 |
| | | | 327/109 |
| 2014/0091833 A1 | 4/2014 | Astrom et al. | |
| 2015/0169488 A1* | 6/2015 | Metzner | G06F 13/4022 |
| | | | 710/316 |
| 2016/0285653 A1* | 9/2016 | Walker | H04L 12/40 |
| 2017/0199837 A1* | 7/2017 | Walker | H04L 12/40169 |
| 2019/0272248 A1* | 9/2019 | Metzner | G06F 13/4022 |
| 2020/0364171 A1* | 11/2020 | Brando | G06F 13/4022 |
| 2021/0167989 A1* | 6/2021 | Broughton | H04L 12/40013 |

* cited by examiner

FIELD BUS DRIVER CIRCUIT

This application claims priority to German Patent Application Number 102020127165.4 filed on Oct. 15, 2020, the entire content of which is incorporated herein by reference.

TECHNICAL FIELD

This disclosure relates to the field of bus driver circuits, in particular a transmitter portion of a bus driver circuit (transceiver) suitable for driving bus lines e.g. according to standardized bus systems such as Controller Area Network (CAN) or FlexRay.

BACKGROUND

In the field of field bus systems such as CAN or FlexRay, recent developments aim at increasing the data rate. This is challenging because, in practice, typical bus topologies may include stubs and not properly terminated bus nodes. These inhomogeneous networks suffer from signal reflections due to impedance mismatches. In receiving nodes (with the transmitter being in a high ohmic state) a high input capacitance leads to delays in the signal propagation which may have a negative impact on the overall signal integrity in the network at higher data rates. Therefore, it is desirable that the input capacitance of the receiver portion of a bus driver circuit is as low as possible while the transceiver is receiving data. If the transmitter is sending data, the signal integrity is much less affected by a high input capacitance.

Typical architectures for differential bus drivers (such as e.g. for CAN buses) include, for example, DMOS cascode stages with an isolated bulk (DMOS=Double diffused Metal Oxide Semiconductor). The cascode stages usually are switched on permanently. The transitions from high to low differential bus voltage (and vice versa) are controlled by the high-side and low-side switches. The DMOS cascode stages are required to withstand high Voltages (e.g. greater than 40 V) which may occur on the bus terminals. Diodes (e.g. the intrinsic body diodes od MOS transistors) can be used to prevent reverse current flow. In some applications, the MOS diodes are directly connected to the bus terminals, which brings benefits in terms of electromagnetic compatibility (EMC) performance and a symmetrical bus input capacitances with respect to the two differential bus lines. However, some semiconductor technologies do not allow such a circuit topology.

In some semiconductor technologies, the position of the cascode stage and the diode needs to be interchanged, which entails the problem that one cascode stage is contacted directly to a bus terminal. Due to the relatively large gate-source capacitances, gate-drain capacitances, and substrate capacitances, the cascode stage remarkably contributes to the overall input capacitance of the bus driver. Furthermore, the input capacitances of the two differential bus terminals are not symmetrical in such a topology, which can have negative impact on the EMC performance. Therefore, there is a need for improved bus driver circuits with unsymmetric input capacitances due to cascode stages that are not symmetrically connected to the bus lines.

SUMMARY

A transmitter circuit for a field bus driver is described herein. In accordance with one embodiment the transmitter circuit includes a first bus terminal and a second bus terminal for connecting a first bus line and, respectively, a second bus line. The transmitter circuit further includes a first supply terminal for receiving a supply voltage and second supply terminal for receiving a reference voltage, a first switching circuit coupled between the first supply terminal and the first bus terminal, and a second switching circuit coupled between the second bus terminal and the second supply terminal. The first switching circuit includes a first transistor and a second transistor, and the second switching circuit includes a third transistor and a fourth transistor. Further, the transmitter circuit comprises control circuitry configured to generate first drive signals for the first transistor and the third transistor and second drive signals for the second transistor and the fourth transistor based on a transmit signal. The control circuitry is further configured to generate the second drive signals such that: the second transistor and the fourth transistor are switched on in response to the transmit signal indicating a transition from a recessive to a dominant bus state, and the second transistor and the fourth transistor are switched off when the transmit signal indicates a recessive bus state and a specific first delay time has lapsed since the transmit signal indicating a transition from a dominant to a recessive bus state. Furthermore, a corresponding method for operating a transmitter circuit for a field bus driver is described herein.

BRIEF DESCRIPTION OF THE DRAWINGS

The embodiments described below can be better understood with reference to the following drawings and descriptions. The components in the figures are not necessarily to scale; instead emphasis is placed upon illustrating the principles of the invention. Moreover, in the figures, like reference numerals designate corresponding parts. In the drawings.

DETAILED DESCRIPTION

The embodiments described herein are related to a bus driver (transceiver) circuit for a CAN bus node. It is understood that the concepts described herein may readily be applied to other kinds of field busses such as, for example, FlexRay. Furthermore, it is noted that the Figures only include the transmitter portion of the transceiver circuit. It is understood that the respective receiver portions, which have been omitted to keep the drawings simple, can be added. Various suitable receiver circuit implementations are as such known and are thus not further discussed herein.

Figure 1:
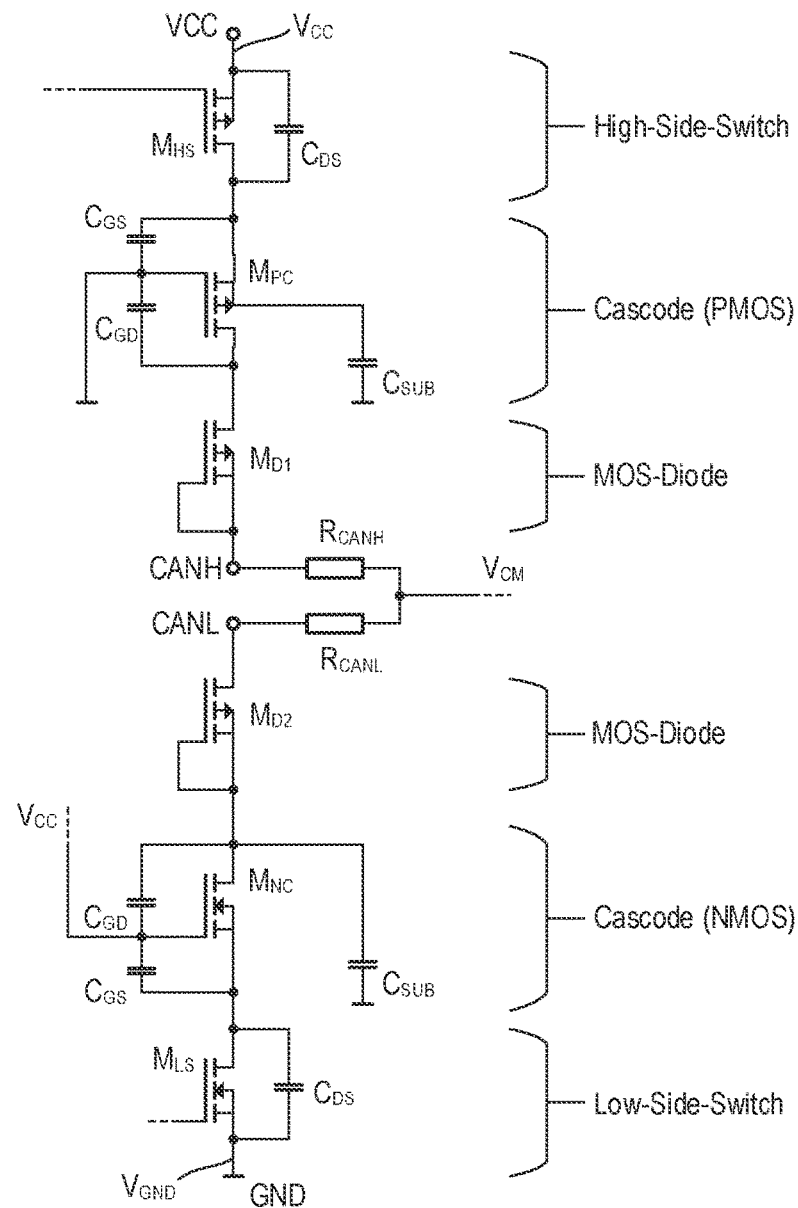
FIG. 1 illustrates one example of a symmetric transmitter portion of a bus driver (transceiver) circuit.

FIG. 1 illustrates one example of a symmetric transmitter portion of a bus driver (transceiver) circuit. It is noted that such a symmetric transmitter topology is only feasible when the driver circuit is integrated using some specific semiconductor manufacturing technologies.

The example of FIG. 1 can be structured in a high-side circuit coupled between a first supply terminal VCC (that receives supply voltage $V_{CC}$) and a first bus terminal CANH and a low side circuit coupled between a second bus terminal CANL and a second supply terminal GND (being at a reference voltage $V_{GND}$, e.g. ground potential). The high-side circuit includes a series circuit of a first electronic switch (high-side transistor $M_{HS}$), a transistor $M_{PC}$ forming a first cascode stage (also referred to as cascode circuit), and a first MOS diode $M_{D1}$. Likewise, the low-side circuit includes a series circuit of a second MOS diode $M_{D2}$, a transistor $M_{NC}$ forming a second cascode stage, and second electronic switch (low-side transistor $M_{LS}$). The transistor of the first cascode stage is a p-channel MOS (PMOS) transistor, whereas the transistor of the second cascode stage is an n-channel MOS (NMOS) transistor. Similarly, the first electronic switch includes a (high-side) PMOS transistor $M_{LS}$, whereas the second electronic switch includes a (low-side) NMOS transistor $M_{LS}$. The MOS diodes $M_{D1}$ and $M_{D2}$ can be formed by the intrinsic drain-bulk-diodes of PMOS transistors whose gate electrode is connected to the respective source electrode.

As shown in FIG. 1, the first and the second bus terminal CANH, CANL are each connected to a voltage source providing the common mode voltage $V_{CM}$ via resistors $R_{CANH}$ and, respectively, $R_{CANL}$, which may have resistances in the order of several ten kiloohms. The capacitances $C_{GD}$ and $C_{GS}$ shown in FIG. 1 denote the intrinsic (parasitic) capacitances between gate and drain and, respectively, gate and source of the transistors $M_{PC}$, $M_{NC}$ forming the cascode stages. The capacitances $C_{SUB}$ denote the intrinsic capacitances between the bulk terminals of the transistors forming the cascode stages. The capacitances $C_{DS}$ denote the intrinsic drain-source capacitances of the transistors forming the first and the second electronic switch.

As mentioned, a symmetric circuit structure, in which the MOS diodes are connected between the bus terminals CANL, CANH and the respective cascode stages $M_{NC}$, $M_{PC}$, is not feasible for some semiconductor technologies. For example, in some semiconductor technologies, the low-ohmic connection of the source electrode of PMOS transistor $M_{D1}$, which acts as diode, and the n-doped epitaxy layer of the wafer may lead to relatively large substrate currents during negative bus voltages. Therefore, the positions of the PMOS cascode stage and the MOS diode need to be interchanged as illustrated in FIG. 2 in the high-side circuit.

Figure 2:
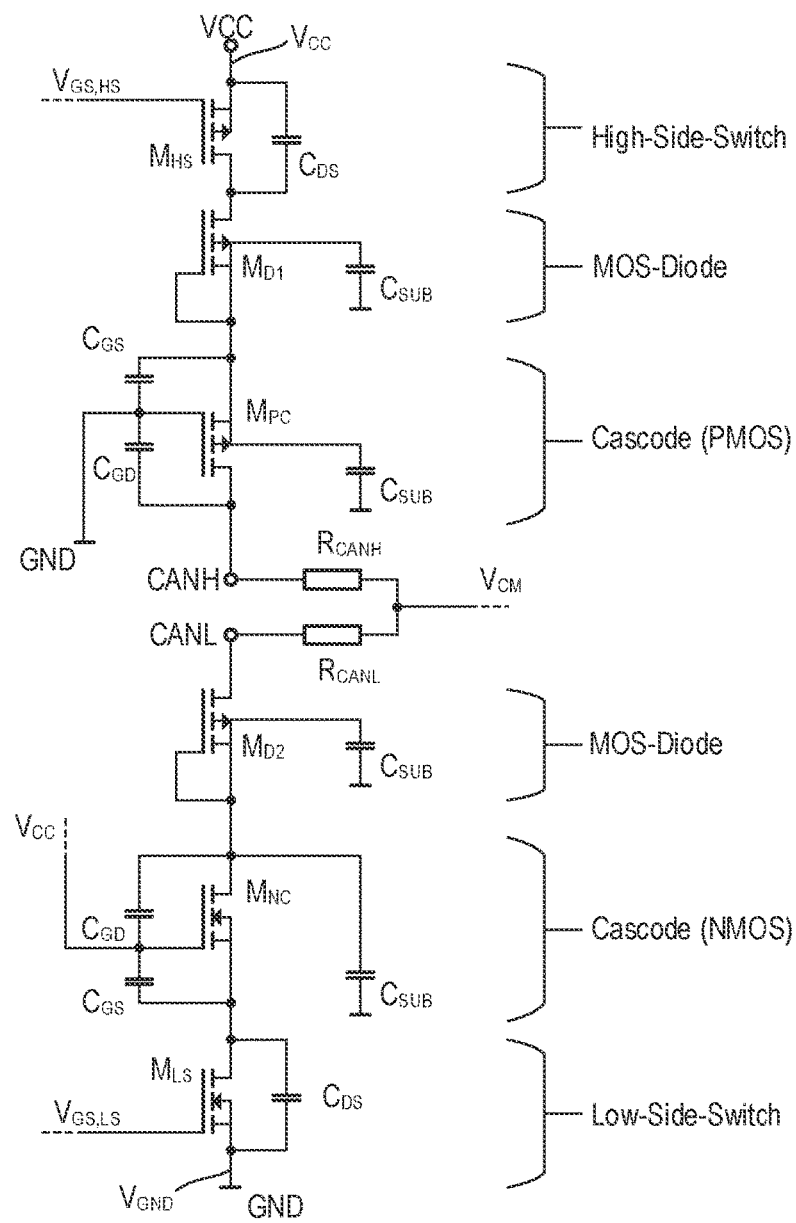
FIG. 2 illustrates one example of an unsymmetric transmitter portion of a bus driver circuit; in some semiconductor technologies the symmetric version of FIG. 1 cannot be implemented.

The example of FIG. 2 is basically the same as the previous example of FIG. 1. The only difference between the two examples is that the positions of MOS diode (transistor $M_{D1}$) and cascode stage (transistors $M_{PC}$) is interchanged which results in an unsymmetric input capacitance at the bus terminals CANH, CANL. FIGS. 1 and 2 illustrate the usual cascode configuration, in which the gate of PMOS transistor $M_{PC}$ is biased with ground potential and the gate of the NMOS transistor $M_{NC}$ is biased with supply potential $V_{CC}$.

Figure 3:
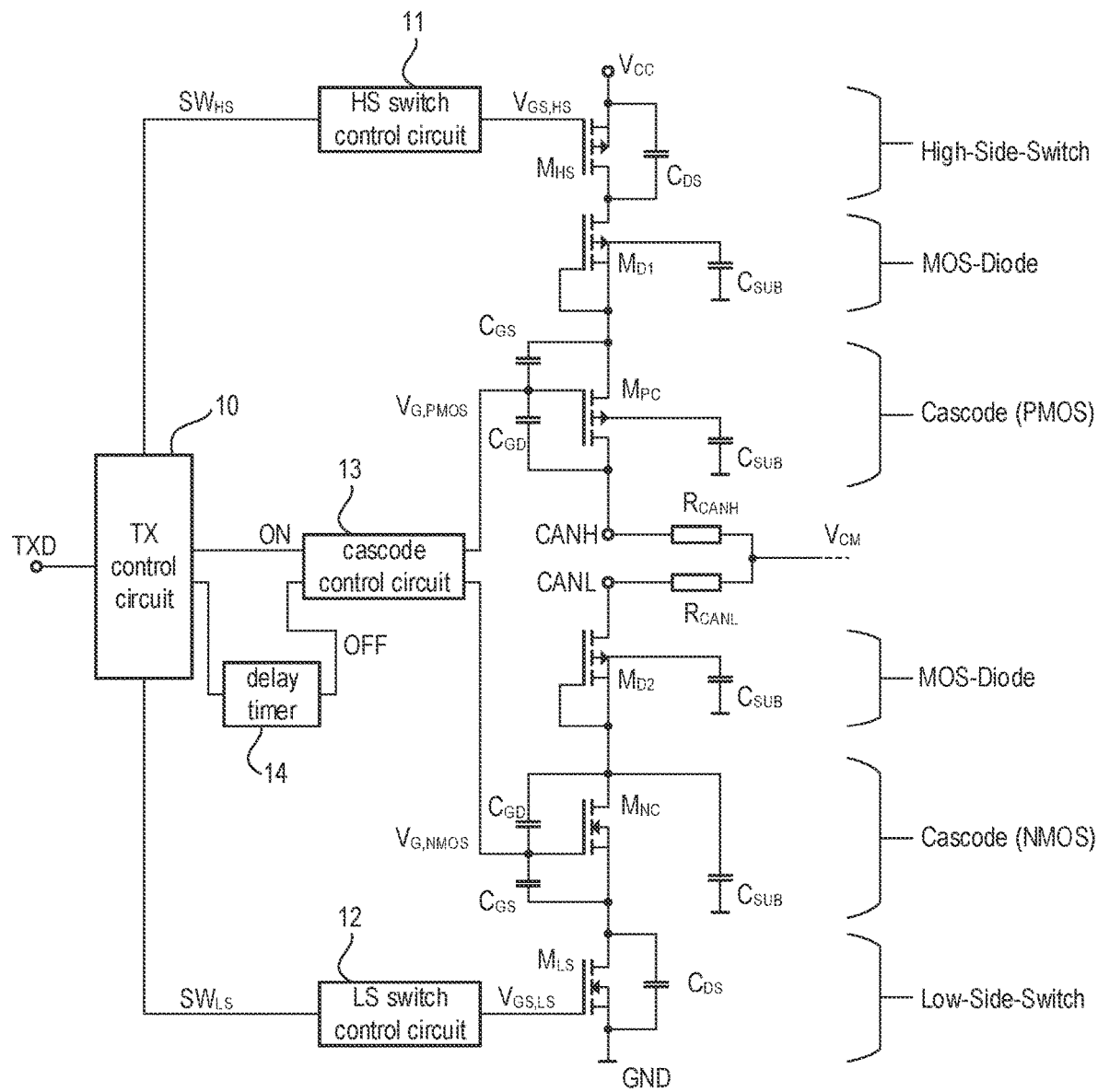
FIG. 3 illustrates one embodiment of an improved bus driver circuit with switchable cascode stages.

FIG. 3 illustrates one exemplary implementation of the transmitter portion of a bus driver circuit, in which the cascode stages are switched on and off instead being constantly biased. That is, the high-side circuit and the low-side circuit (transistors $M_{HS}$, $M_{LS}$, the respective cascode stages $M_{PC}$, $M_{NC}$, and the MOS diodes $M_{D1}$, $M_{D2}$) are implemented the same way as shown in FIG. 2. In addition thereto, the circuit of FIG. 3 includes various control circuitry for controlling the switching states of the transistors $M_{HS}$, $M_{LS}$ and the respective cascode stages $M_{PC}$, $M_{NC}$. The transmitter control circuit 10 receives an input data signal TXD (transmit signal) and generates corresponding switching signals $SW_{HS}$, $SW_{LS}$ for the transistors $M_{HS}$, $M_{LS}$. In case of a CAN bus system a high level of the input data signal TXD usually indicates a recessive state (bus voltage is low) whereas a low level of the input data signal TXD indicates a dominant state (bus voltage is actively set to high level). The switching signals $SW_{HS}$, $SW_{LS}$ are converted into corresponding gate-source voltages $V_{GS,HS}$, $V_{GS,LS}$ for the for the transistors $M_{HS}$, $M_{LS}$ by gate driver circuits 11 and 12. Various common gate driver implementations are as such known and thus not further discussed herein.

In essence, the transmitter control circuit 10 triggers a switch-on of the transistors $M_{HS}$, $M_{LS}$ in response to the input data signal TXD indicating a dominant state, and triggers a switch-off of the of the transistors $M_{HS}$, $M_{LS}$ in response to the input data signal TXD indicating a recessive state. Thus, a high voltage level is actively output between the bus terminals CANH and CANL in a dominant state, and the bus voltage between bus terminals CANH and CANL is pulled down to a low voltage level (zero in steady state) by resistors $R_{CANH}$ and $R_{CANL}$.

The transmitter control circuit 10 is further configured to generate a switching signals ON and OFF for switching the cascode stages (transistors $M_{PC}$ and $M_{NC}$) on and off, respectively in accordance with the input data signal TXD. The signal OFF, which triggers a switch-off of the cascode stages is subject to a delay $t_{DEL}$ (see FIG. 3, delay block 14). The cascode control circuit 13 receives the signals ON and OFF and generates corresponding gate-source voltages $V_{G,PMOS}$, $V_{G,NMOS}$ for the transistors $M_{PC}$ and $M_{NC}$. The function of the transmitter control circuit 10 with regard to the switching of the cascode stages is further explained with reference to the timing diagrams of FIG. 4.

In the example the input data signal TXD indicates a recessive state between time instants $t_0$ and $t_1$, between time instants $t_2$ and $t_4$, and between time instants $t_5$ and $t_6$. A dominant state is indicated outside the recessive time intervals. The recessive states between time instants to and $t_1$ as well as $t_5$ and $t_6$ are shorter than the delay time $t_{DEL}$ ($t_1-t_0<t_{DEL}$, $t_6-t_5<t_{DEL}$), whereas the recessive state between time instants $t_2$ and $t_4$ is longer than the delay time $t_{DEL}$ ($t_4-t_2>t_{DEL}$). Both cascode transistors $M_{PC}$, $M_{NC}$ are in an on-state while the input data signal TXD indicates a dominant state, e.g. for times before time instant to. When the input data signal TXD changes from a dominant state into a recessive state, the cascode transistors $M_{PC}$, $M_{NC}$ are switched off a delay time $t_{DEL}$ after the transition (see, e.g. FIG. 4, transition at time instant $t_2$, switch-off of cascode transistors at time instant $t_3$) The switch-off of the cascode transistors only takes place if the input data signal TXD still indicates a recessive state after the delay time $t_{DEL}$ (e.g. at time instant $t_3$ in FIG. 4). When the input data signal TXD changes from a recessive state into a dominant state, the cascode transistors $M_{PC}$, $M_{NC}$ are switched on without significant delay (see, e.g. FIG. 4, transition at time instant $t_4$) unless they are already on. In contrast, when the input data signal TXD changes from the dominant state into a recessive state, the cascode transistors $M_{PC}$, $M_{NC}$ are switched off a delay time $t_{DEL}$ after the transition to the recessive state (see, e.g. FIG. 4, transition at time instant $t_2$, corresponding switch-off at time instant $t_3=t_2+t_{DEL}$).

Figure 4:
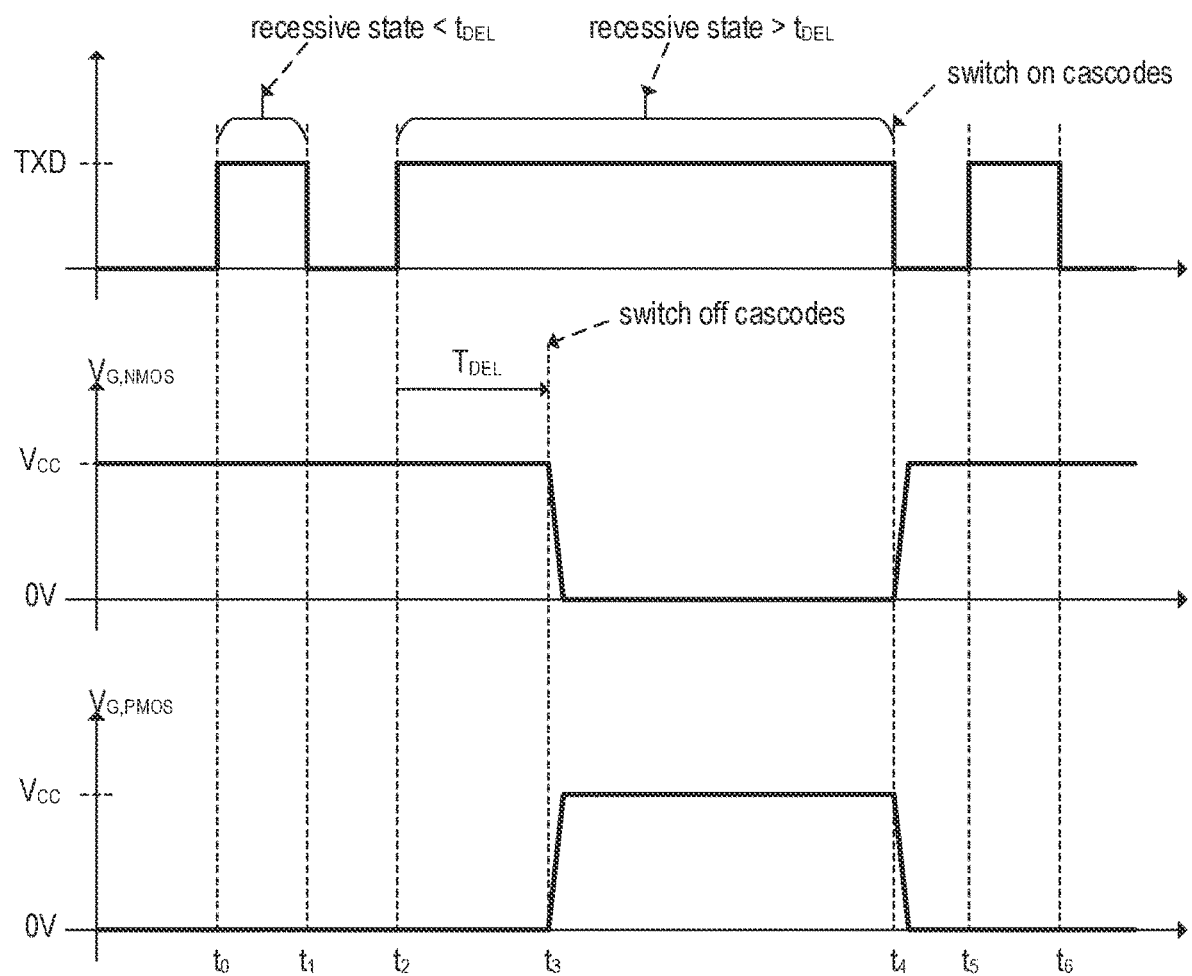
FIG. 4 illustrates an exemplary timing diagram showing the function of the circuit of FIG. 3.

As can be seen in FIG. 4 the insertion of the delay $t_{DEL}$ has the effect, that recessive states with a duration shorter than the delay time $t_{DEL}$ do not result in a switch-off of the cascode transistors $M_{PC}$, $M_{NC}$. In the example of FIG. 4 this is the case for the first recessive state between $t_0$ and $t_1$ and the third recessive state between $t_5$ and $t_6$. The delay time $t_{DEL}$ is usually set such that it is longer than the longest recessive period that can occur during a normal CAN frame (e.g. five consecutive recessive bits). Longer recessive periods usually only occur when the transceiver is not actively transmitting data. Thus, the cascode stages will usually be on while the transmitter is transmitting data across the bus and will usually be off while the transceiver is listening. The delay time $t_{DEL}$ naturally depends on the data rate of the CAN bus system and may be in the range of a few ten microseconds (e.g. 10-100 μs).

Figure 5:
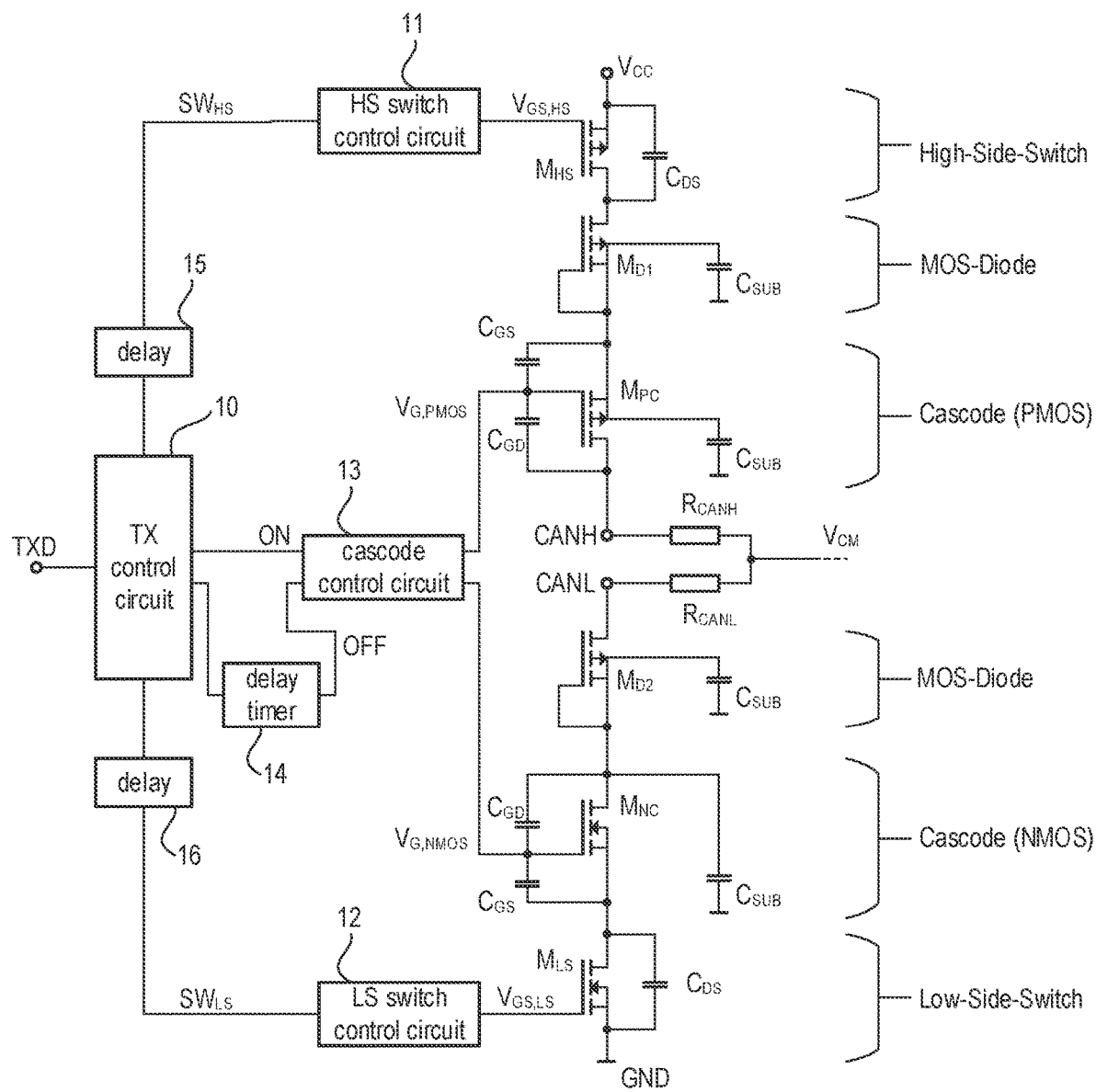
FIG. 5 illustrates a modified/enhanced version of the embodiment of FIG. 3.

The example of FIG. 5 is basically the same as the example of FIG. 3 with the only difference that the signals $SW_{HS}$ and $SW_{LS}$ are delayed for a short time (e.g. a few nanoseconds, see delay blocks 15, 16) so that the cascode stages are already fully switched on when the switch-on process of the high-side and low-side transistors $M_{HS}$, $M_{LS}$ is initiated. Apart from the delay blocks 15, 16, the circuit of FIG. 5 is the same as the circuit of FIG. 3. Various suitable implementations of the delay blocks 15, 16 are as such known and thus not further explained herein in more detail.

Figure 6:
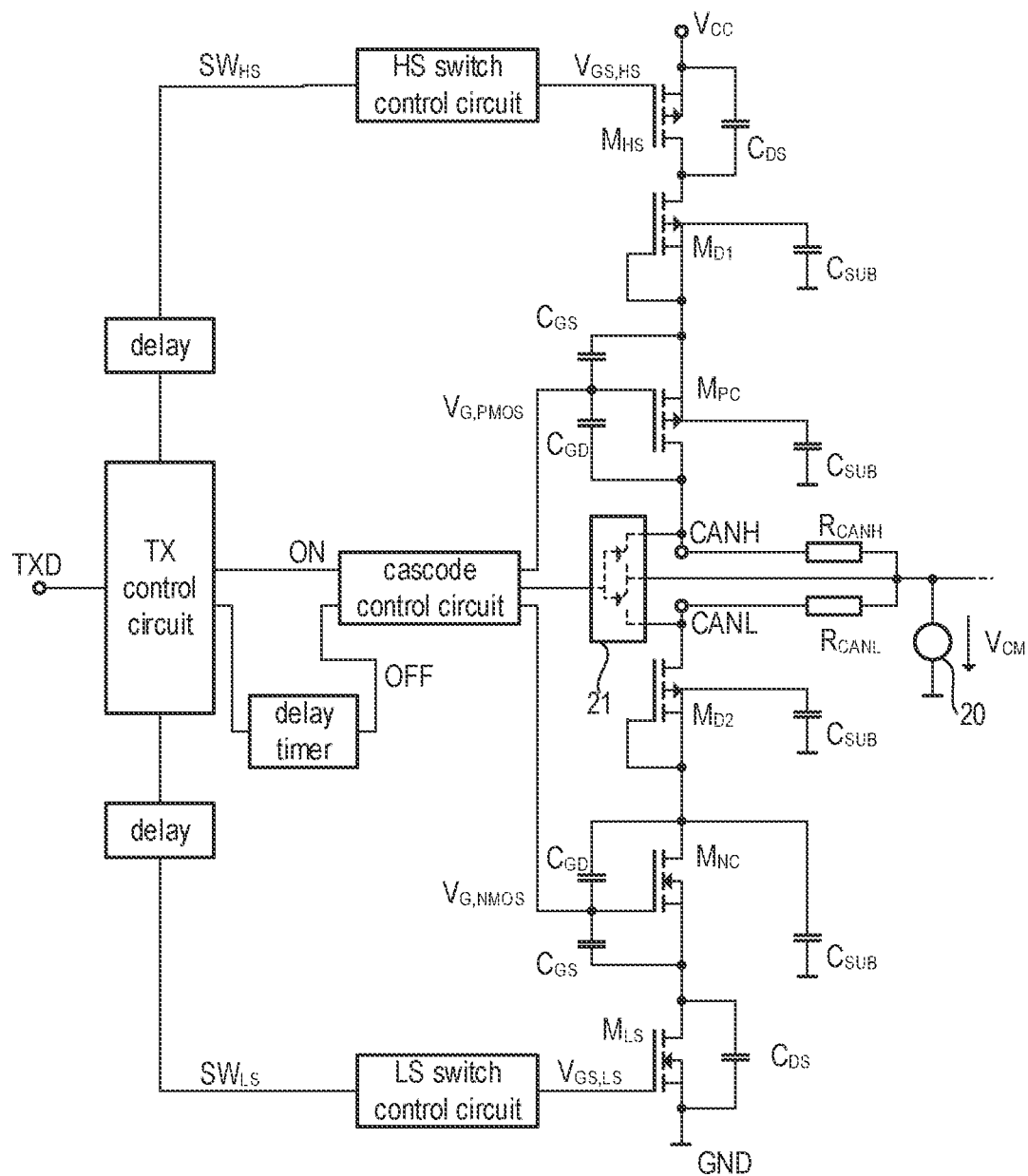
FIG. 6 illustrates an embodiment, which can be regarded as a further development of the example of FIG. 3 or 5.

The example of FIG. 6 can be regarded as an enhancement of the embodiment of FIG. 5. FIG. 5 and FIG. 6 are basically identical except for the switching circuit 21 that is connected between the voltage source 20 generating the common mode voltage $V_{CM}$ and the bus terminals CANH and CANL. The switching circuit 21 may be regarded as a compensation circuit that is configured to connect both, the first bus terminal CANH and the second bus terminal CANL, with the voltage output (voltage $V_{CM}$) of the common mode voltage source 20 during a switching process of the cascode transistor stages $M_{PC}$, $M_{NC}$ in order to bypass the resistors $R_{CANH}$, $R_{CANL}$.

The compensation circuit 21 (switching circuit) allows to reduce the common mode voltage disturbances at the bus terminals CANH and CANL. As mentioned, the resistances of resistors $R_{CANH}$, $R_{CANL}$ have nominal values in the order of a few ten kiloohms. Therefore, the balancing currents provided by the common mode voltage source 20 during a switching process is limited. As a consequence, the switching currents arising from the switching of the cascode stages can cause relatively strong disturbances of the common mode voltage at the bus nodes CANH, CANL. Bypassing the resistors $R_{CANH}$, $R_{CANL}$ effectively reduces the resistances between the common mode voltage source 20 and the bus nodes CANH and CANL and thus reduces the mentioned disturbances. During the switching of the cascode stages, the compensation circuit 21 provides a low-ohmic connection between the bus nodes CANH and CANL and the common-mode voltage source 20.

In practice it is desired that the compensation circuit 21 is robust enough to comply with the ESD requirements for the bus transceiver (ESD=electrostatic discharges). In one embodiment, the resistors $R_{CANH}$ and $R_{CANL}$ are bypassed by switching on additional transistors included in the compensation circuit 21. In another embodiment, bypassing the resistors $R_{CANH}$ and $R_{CANL}$ is implemented by connecting the bus nodes CANH and CANL with a further common node voltage source (not shown in FIG. 6) different from the voltage source 20.

The high-side and low-side transistors $M_{HS}$, $M_{LS}$ as well as the transistors forming the cascode stages can be implemented in a transistor cell array including a plurality of transistor cells whose drain-source current paths are connected in parallel. Such an implementation in the form of a transistor cell array is very common, particularly for DMOS transistors and thus not further discussed herein in more detail. In one embodiment the gates of the individual transistor cells of the high-side transistor $M_{HS}$ are driven by staggered gate signals so as to activate or deactivate the transistors cells consecutively during the switch-on/switch-off process in order to achieve a specific desired shape of the switching edge. This concept is also as such known and often referred to as "edge shaping".

Figure 7:
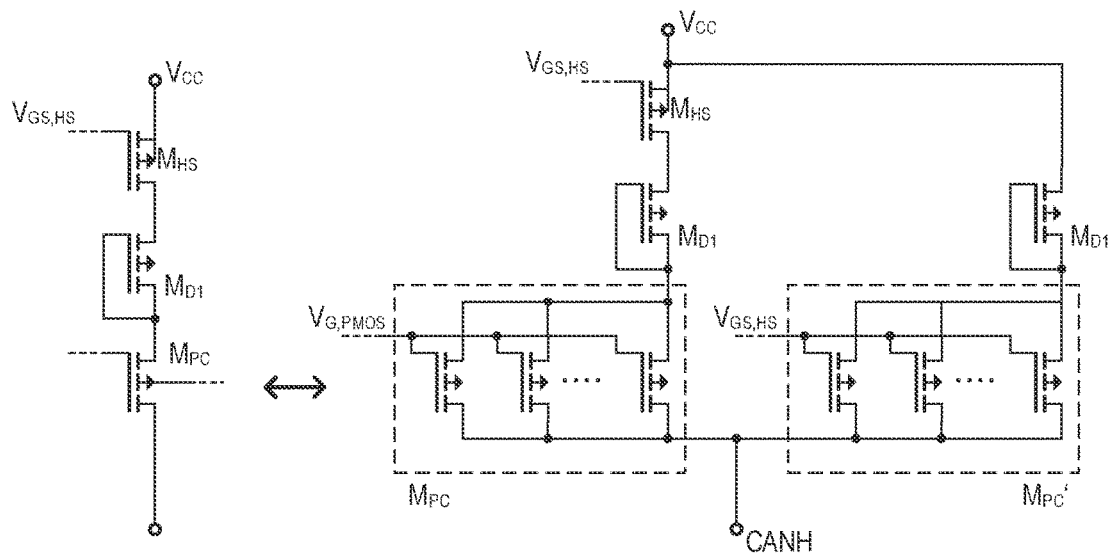
FIG. 7 illustrates one modification of the example of FIG. 3.

FIG. 7 illustrates one example of the high-side circuit, in which the transistor $M_{PC}$ is implemented in a transistor cell array including a plurality of parallel transistor cells. In addition thereto, a further group of transistor cells (in the same of in another cell array) forms another transistor $M_{PC}'$ which is coupled between the supply node $V_{CC}$ and the bus node CANH. A further MOS diode $M_{D1}'$ is coupled in series to the transistor $M_{PC}'$. The gates of the transistor cells that form the transistor $M_{PC}'$ are driven, for example, by the same gate signal $V_{GS,HS}$ as the high-side transistor $M_{HS}$. As can be seen in FIG. 7, the series circuit of the additional transistor $M_{PC}'$ and the additional MOS diode $M_{D1}'$ can provide, when switched on, an additional current path parallel to the high-side circuit ($M_{PC}$, $M_{D1}$, and $M_{HS}$). The low-side circuit can be modified/enhanced in the same way analogous to the example of FIG. 7 which relates to the high side.

Figure 8:
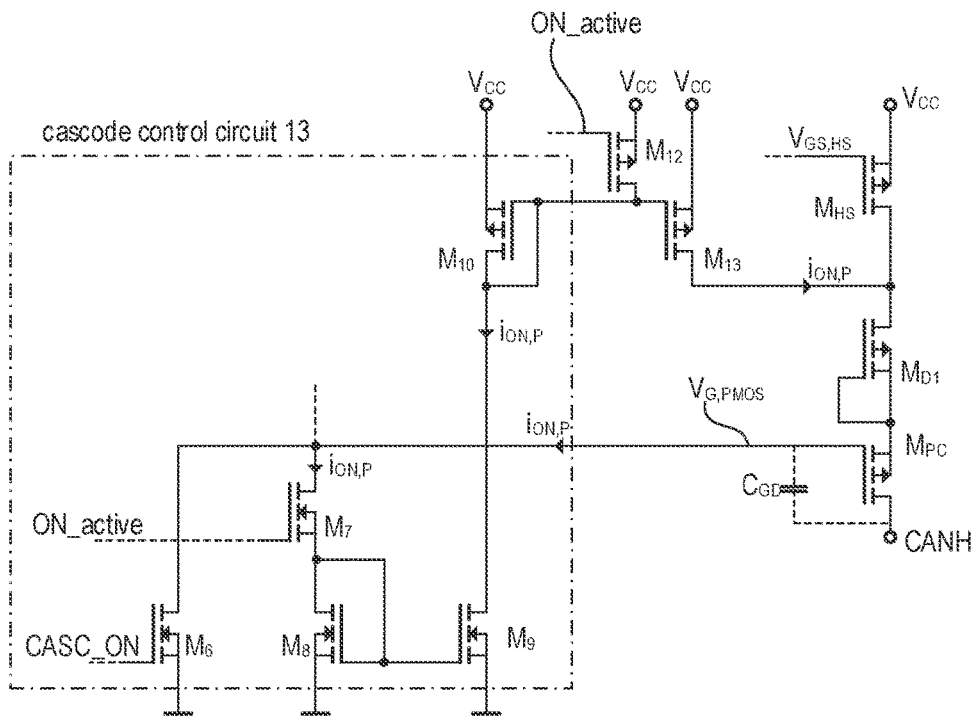
FIGS. 8 to 13 illustrate an embodiment, which can be regarded as a further development or improvement of the example of FIG. 3 or 5.
Figure 10:
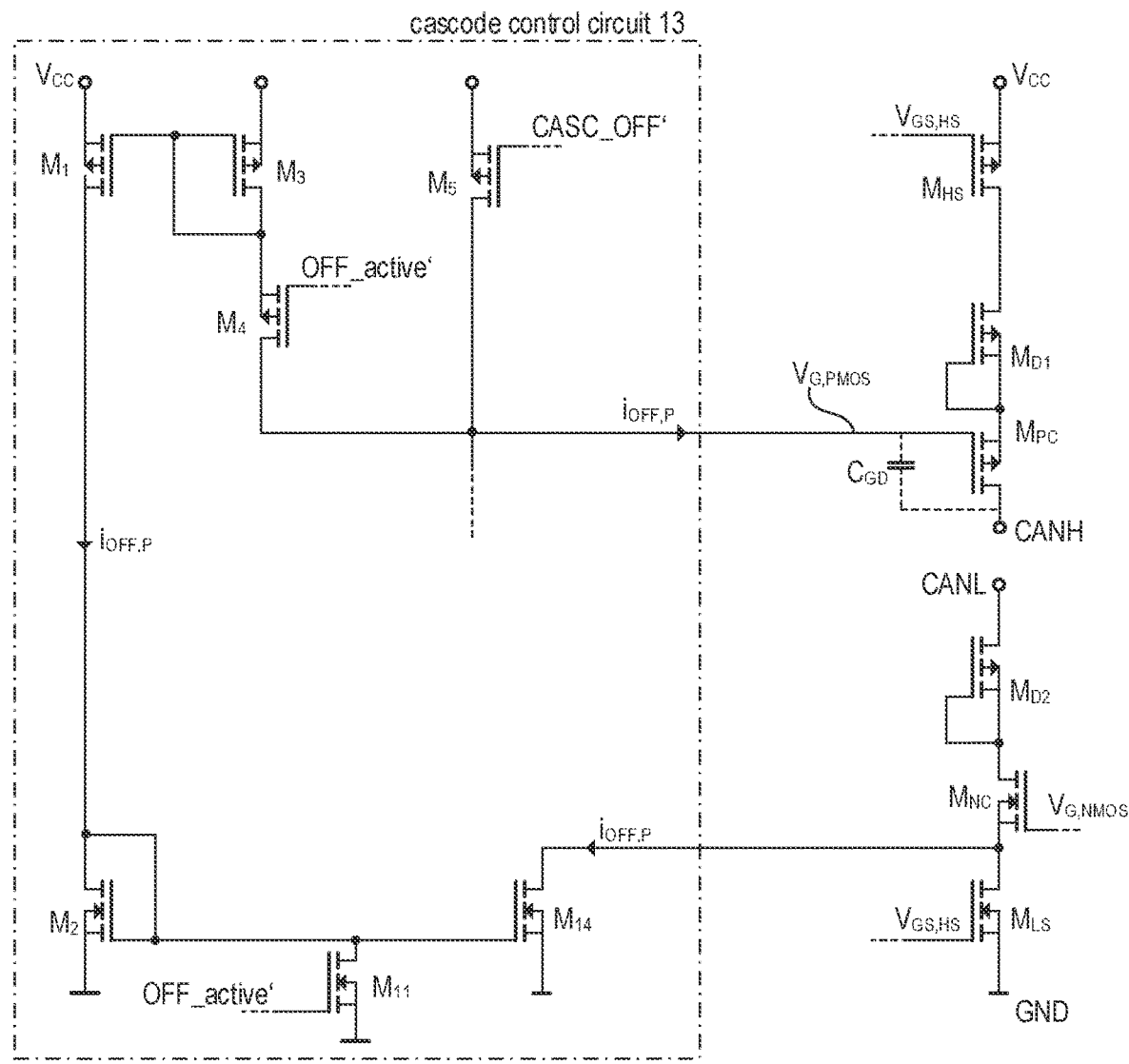
Figure 12:
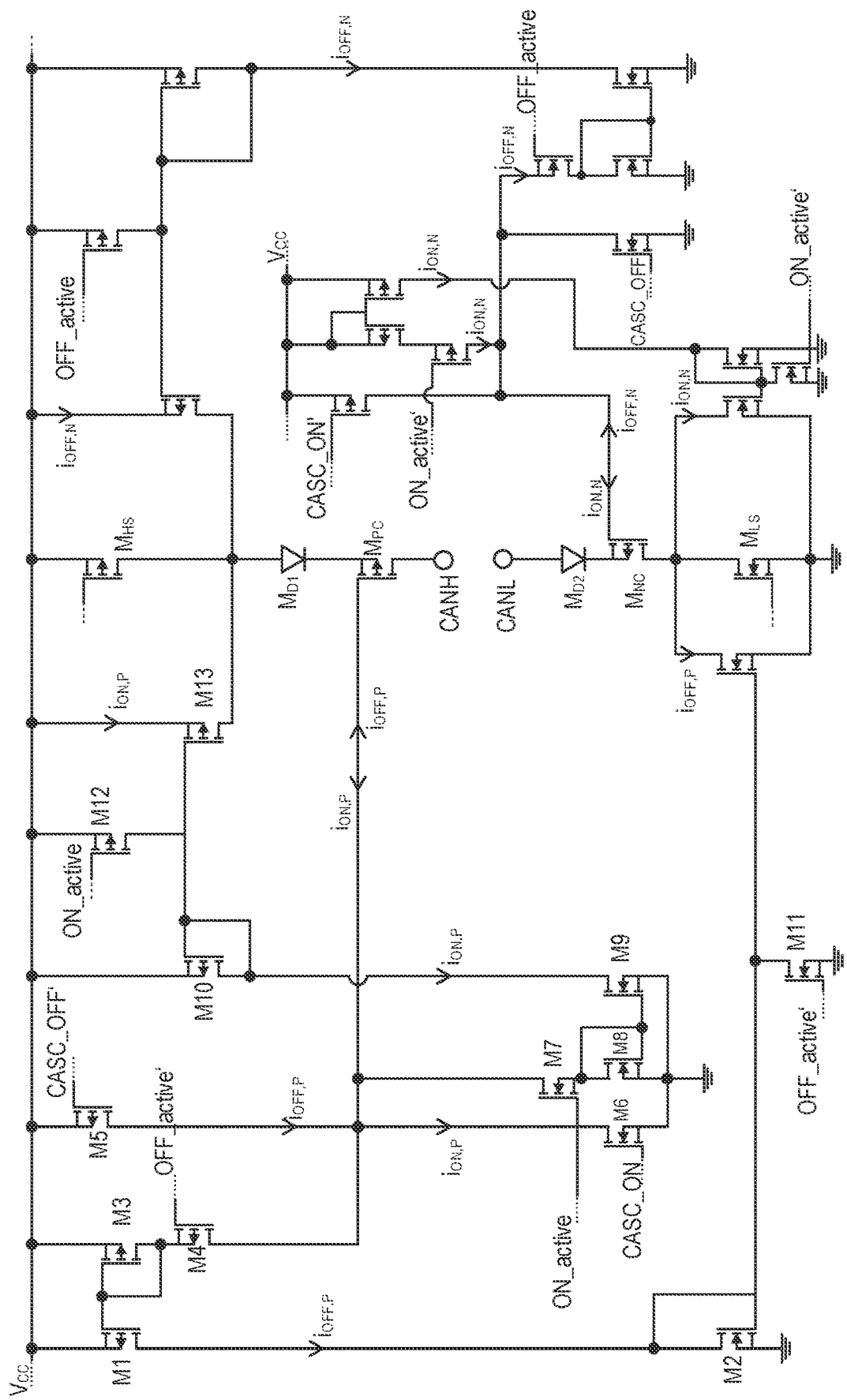

FIG. 8 illustrates an exemplary implementation of a further embodiment, which may be regarded as an enhancement of the example of FIG. 3. In particular, FIG. 8 illustrates a portion of the cascode control circuit 13 (see FIG. 3) in more detail. Another portion of the circuit is shown in FIG. 10; the full circuit is shown in FIG. 12. However, to simplify the discussion, only those circuit components are included in FIG. 8, which are needed to switch on the cascode stage (transistor $M_{PC}$) in the high-side-circuit. The same concept can be applied to the switch-on of the cascode stage (transistor $M_{NC}$) in the low-side-circuit as well as to the switch-off of the cascode circuits.

Figure 9:
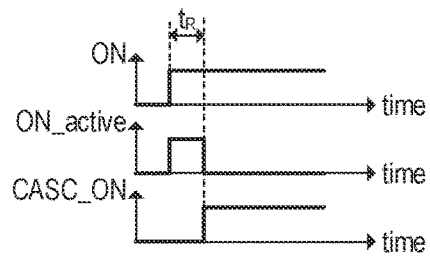

The circuit of FIG. 8 processes (inter alia) control signals CASC_ON and ON_active, which can be derived from the control signal ON (see also FIG. 3) as shown in the timing diagram of FIG. 9. In the present example, a switch-on of the high-side cascode stage is triggered by the control signal ON changing from a low level to a high level. This level transition triggers a pulse (high level) of a defined pulse length $t_R$ in the signal ON_active. The end of this pulse (in the signal ON_active) triggers a transition from low level to high level in the signal CASC_ON. In essence, the rising edge in signal CASC_ON follows the rising edge in the control signal ON with a delay $t_R$, wherein signal ON_active is high between the two corresponding rising edges.

As mentioned, the circuit portion of FIG. 8 is designed to switch on the high side cascode stage (transistor $M_{PC}$). The cascode control circuit of FIG. 8 is further designed such that it generates—during a switch-on process of the high-side cascode stage (transistor $M_{PC}$)—a compensation current $i_{ON,P}$ equal to a gate current of the transistor $M_{PC}$ and injects the compensation current $i_{ON,P}$ into a load current path of the transistor $M_{PC}$. The duration of the switch-on process depends on the intrinsic capacitances and is known for a specific implementation and approximated by the time $t_R$ which is the pulse length of the above-mentioned pulse in the signal ON_active.

In an off-state, the gate-drain capacitance $C_{GD}$ of the transistor $M_{PC}$ is charged. The gate voltage $V_{G,PMOS}$ is at a high level (approximately equal to $V_{CC}$). Reference is made to the circuit of FIG. 8. The switch-on process is initiated with a rising edge in signal ON_active. A high level of signal ON_active switches on transistor $M_7$ and switches off transistor $M_{12}$. An activated (=switched on) transistor $M_7$ allows discharging of the gate-drain capacitance $C_{GD}$ via the load paths of transistor $M_7$ and transistor $M_8$. The discharging current is denoted as $i_{ON,P}$. Transistor-pairs $M_8$, $M_9$ and $M_{10}$, $M_{13}$ form 1:1 current mirrors. As a consequence, the load current of transistors $M_9$ and $M_{10}$ as well as the load current of transistor $M_{13}$ equals the gate current $i_{ON,P}$ during the switch-on process. The load current of transistor $M_{13}$ is the above-mentioned compensation current. As shown in FIG. 8, this compensation current is injected in the load current path (drain-source-current path) of the cascode stage (transistor $M_{PC}$). The compensation current helps to maintain the voltage at the respective bus node CANH while switching the cascode stages and to avoid common mode disturbances. It is noted that in FIG. 8, the gate-drain capacitance Cm represents the effective capacitance between gate and drain electrode of the cascode transistor $M_{PC}$, and the circuit is closed via the resistor $R_{CANH}$ and the common-mode voltage source 20 (not shown in FIG. 8, see FIG. 6).

After the time period $t_R$, the signal ON_active changes to a low level which causes a switch-off of transistor $M_7$ and a switch-on of transistor $M_{12}$, which basically deactivates the current mirrors $M_8$, $M_9$ and $M_{10}$, $M_{13}$. At the same time, the transistor $M_6$ is switched on in order to maintain the gate voltage $V_{G,PMOS}$ low (and the gate capacitance discharged) and thus the high-side cascode stage on.

A similar concept can be used to compensate the gate current during a switch-off period. A complementary circuit (i.e. PMOS and NMOS components are interchanged) may be used to switch the low-side cascode stage (transistor $M_{NC}$) on and off an example is illustrated in FIG. 10.

FIG. 10 illustrates the portion of the cascode control circuit 13 which is responsible for switching the high-side cascode off. The circuit of FIG. 10 processes control signals CASC_OFF' and OFF_active', which can be derived from the control signal OFF (see also FIG. 3) as shown in the timing diagram of FIG. 11. In the present example, a switch-off of the high-side cascode stage is triggered by the control signal OFF changing from a high level to a low level. This level transition triggers an inverted pulse (low level) of a defined pulse length $t_R$ in the signal OFF_active'. The end of this pulse (in the signal OFF_active') triggers a transition from high level to low level in the signal CASC_OFF'. In essence, the falling edge in signal CASC_OFF' follows the falling edge in the control signal OFF with a delay $t_R$, wherein signal OFF_active' is low between the two corresponding falling edges.

Conversely to the circuit portion of FIG. 8, the circuit portion of FIG. 10 is designed to switch off the high side cascode stage (transistor $M_{PC}$). The cascode control circuit of FIG. 10 is further designed such that it generates—during a switch-off process of the high-side cascode stage (transistor $M_{PC}$)—a compensation current $i_{OFF,P}$ equal to a gate current of the transistor $M_{PC}$ and injects the compensation current $i_{OFF,P}$ into a load current path of the transistor $M_{NC}$ (low-side cascode stage). The duration of the switch-off process depends on the intrinsic capacitances and is known for a specific implementation and approximated by the time $t_R$ which is the pulse length of the above-mentioned pulse in the signal OFF_active' (analogously to signal ON_active).

In an on-state, the gate-drain capacitance $C_{GD}$ of the transistor $M_{PC}$ is discharged. The gate voltage $V_{G,PMOS}$ is at a low level (approximately equal to ground potential). Reference is made to the circuit of FIG. 10. The switch-off process is initiated with a falling edge in signal OFF_active'. A low level of signal OFF_active' (during the low-pulse) switches on transistor $M_4$ and switches off transistor $M_{11}$. An activated transistor $M_4$ allows charging of the gate-drain capacitance $C_{GD}$ via the load paths of transistor $M_4$ and transistor $M_3$. The charging current is denoted as $i_{OFF,P}$. Transistor-pairs $M_1$, $M_3$ and $M_2$, $M_{14}$ form 1:1 current mirrors. As a consequence, the load current of transistors $M_1$ and $M_2$ as well as the load current of transistor $M_{14}$ equals the gate current $i_{OFF,P}$ during the switch-off process. The load current of transistor $M_{14}$ is the above-mentioned compensation current during the switch-off process. As shown in FIG. 10, this compensation current is injected in the load current path (drain-source-current path) of the low-side cascode stage (transistor $M_{NC}$). The compensation current helps to maintain the voltage at the respective bus node CANL while switching the cascode stages and to avoid common mode disturbances.

After the time period $t_R$, the signal OFF_active' changes again to a high level which causes a switch-off of transistor $M_4$ and a switch-on of transistor $M_{11}$, which basically deactivates the current mirrors $M_1$, $M_3$ and $M_2$, $M_{14}$. At the same time, the transistor $M_5$ is switched on in order to maintain the gate voltage $V_{G,PMOS}$ high (und the gate capacitance charged) and thus the high-side cascode stage off.

The examples of FIGS. 8 and 10 illustrate two different portions of the same cascode control circuit 13. The circuit portions of FIGS. 8 and 10 are designed to switch the high-side cascode stage (transistor $M_{PC}$) while compensating for the gate currents during the switching process in order to avoid common mode disturbances at the bus nodes CANH and CANL. The circuitry for switching the low-side cascode can be designed analogously. FIG. 12 illustrates the full circuit.

As explained above, the circuit portions of FIGS. 8 and 10 relate to the switching of the high-side cascode stage (transistor $M_{PC}$). It is understood that the switching of the low-side cascode stage (transistor $M_{NC}$) can be implemented analogously using complementary (p- and n-channel devices interchanged) circuitry. One example of the full circuit is shown in FIG. 12. In order to avoid unnecessary reiterations, reference is made to the description of FIGS. 8 and 10. The respective timing diagrams are shown in FIG. 13.

Figure 11:
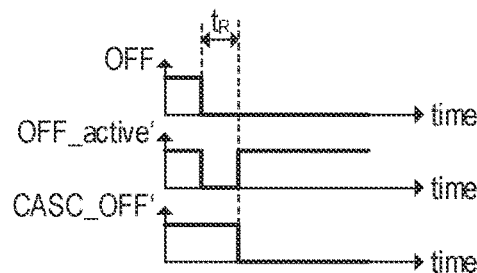
Figure 13:
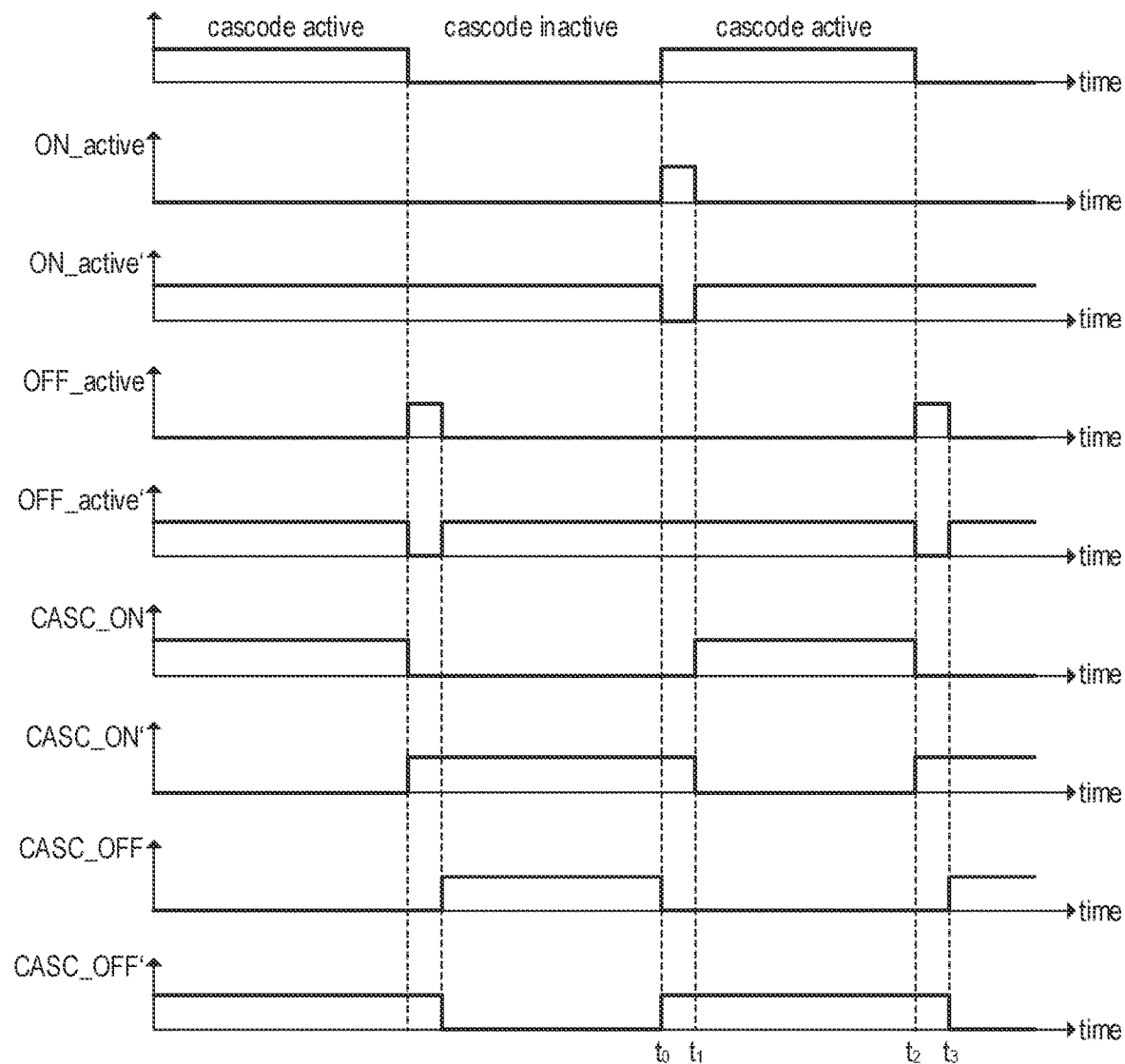

The timing diagrams of FIG. 13 illustrate the full set of signals needed to operate the circuit of FIG. 12. segments of these signals have already been discussed with reference to FIGS. 9 and 11. The signals CASC_ON, CASC_OFF, ON_active and OFF_active, as well as the respective inverted signals CASC_ON', CASC_OFF', ON_active' and OFF_active' can readily be generated from the control signals ON and OFF provided by the transmitter control circuit 10 (see FIG. 5) using a few standard logic devices (gates, monoflops and latches). As can be seen in the example of FIG. 13, a switch-on of the cascode stages is triggered at time $t_0$, wherein first a short pulse is generated in the signal ON_active (and the respective inverted signal ON_active') whereas the corresponding logic level in the signal CASC_ON follows at the end of the pulse at time instant $t_1$. The pulse length $t_R$ equals $t_1-t_0$. Similarly, a switch-off of the cascode stages is triggered at time $t_2$, wherein first a short pulse is generated in the signal OFF_active (and the respective inverted signal OFF_active') whereas the corresponding logic level in the signal CASC_OFF follows at the end of the pulse at time instant $t_3$. The pulse length $t_R$ equals $t_3-t_2$. The intervals $t_3-t_2$ and $t_1-t_0$ may be equal but this is not necessarily the case.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although various embodiments have been illustrated and described with respect to one or more specific implementations, alterations and/or modifications may be made to the illustrated examples without departing from the spirit and scope of the appended claims. With particular regard to the various functions performed by the above described components or structures (units, assemblies, devices, circuits, systems, etc.), the terms (including a reference to a "means") used to describe such components are intended to correspond—unless otherwise indicated—to any component or structure that performs the specified function of the described component (e.g., that is functionally equivalent), even if it is not structurally equivalent to the disclosed structure that performs the function in the herein illustrated exemplary implementations of the invention.

It will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A transmitter circuit for a field bus driver, the transmitter circuit comprising:
a first bus terminal and a second bus terminal for connecting a first bus line and, respectively, a second bus line;
a first supply terminal for receiving a supply voltage and a second supply terminal for receiving a reference voltage; and
a first switching circuit coupled between the first supply terminal and the first bus terminal, and a second switching circuit coupled between the second bus terminal and the second supply terminal;
wherein the first switching circuit includes a first transistor and a second transistor, and the second switching circuit includes a third transistor and a fourth transistor; and
wherein the transmitter circuit further comprises control circuitry configured to generate first drive signals for the first transistor and the third transistor and second drive signals for the second transistor and the fourth transistor based on a transmit signal,
wherein the control circuitry is configured to generate the second drive signals such that:
the second transistor and the fourth transistor are switched on in response to the transmit signal indicating a transition from a recessive to a dominant bus state, and
the second transistor and the fourth transistor are switched off when the transmit signal indicates a recessive bus state and a specific first delay time has lapsed since the transmit signal indicating a transition from a dominant to a recessive bus state.

2. The transmitter circuit of claim 1,
wherein the first switching circuit includes a first diode element coupled to the second transistor and the second switching circuit includes a second diode element coupled to the fourth transistor.

3. The transmitter circuit of claim 2,
wherein the first diode element and the second diode element each comprise a MOS-transistor having a gate electrode connected to a source electrode.

4. The transmitter circuit of claim 2,
wherein the first diode element and the second diode element are formed by intrinsic drain-bulk-diodes of MOS-transistors.

5. The transmitter circuit of claim 1, further comprising:
a fifth transistor coupled between the first bus terminal and the first supply terminal; and
a sixth transistor coupled between the second bus terminal and the second supply terminal.

6. The transmitter circuit of claim 5,
wherein the control circuitry is configured to generate third drive signals for the fifth transistor and the sixth transistor such that the fifth transistor and the sixth transistor switch on and off in synchronization with the first transistor and the third transistor.

7. The transmitter circuit of claim 6,
wherein the control circuitry is configured to generate third drive signals for the fifth transistor and the sixth transistor such that the fifth transistor and the sixth transistor switch on a predetermined time lag after the first transistor and the third transistor.

8. The transmitter circuit of claim 1,
wherein the control circuitry is configured to delay the first drive signals for the first transistor and the third transistor such that the first transistor and the third transistor switch on after the second transistor and, respectively, the fourth transistor.

9. The transmitter circuit of claim 1,
wherein the first transistor and the third transistor both comprise a plurality of transistor cells and/or
wherein the second transistor and the fourth transistor both comprise a plurality of transistor cells.

10. The transmitter circuit of claim 1, further comprising:
a common mode voltage source coupled to the first bus terminal and the second bus terminal via a first resistor and, respectively, a second resistor; and
a compensation circuit configured to connect the common mode voltage source, or another common mode voltage source, with both, the first bus terminal and the second bus terminal, during a switching process of the third transistor and the fourth transistor to bypass the first resistor and the second resistor.

11. The transmitter circuit of claim 1,
wherein the control circuitry includes a control circuit configured to switch the second transistor and the fourth transistor on and off, and further configured to:
generate, during a switch-on process of the second transistor and the fourth transistor, a compensation current equal to a gate current of the second and the fourth transistors, and inject the compensation current into a load current path of the corresponding second and fourth transistor.

12. The transmitter circuit of claim 11,
wherein the control circuit includes a plurality of current mirrors configured to mirror the gate current of the second and the fourth transistors during the switch-on process and generate the compensation current based on the mirrored gate currents.

13. A method for operating a transmitter circuit for a field bus driver that comprises:
    a first bus terminal and a second bus terminal for connecting a first bus line and, respectively, a second bus line;
    a first supply terminal for receiving a supply voltage and second supply terminal for receiving a reference voltage; and
    a first switching circuit coupled between the first supply terminal and the first bus terminal, and a second switching circuit coupled between the second bus terminal and the second supply terminal;
    wherein the first switching circuit includes a first transistor and a second transistor, and the second switching circuit includes a third transistor and a fourth transistor; and
    wherein the method comprises:
    generating first drive signals for the first transistor and the third transistor and second drive signals for the second transistor and the fourth transistor based on a transmit signal, wherein the second drive signals are generated such that:
        the second transistor and the fourth transistor are switched on in response to the transmit signal indicating a transition from a recessive to a dominant bus state, and
        the second transistor and the fourth transistor are switched off when the transmit signal indicates a recessive bus state and a specific first delay time has lapsed since the transmit signal indicating a transition from a dominant to a recessive bus state.

* * * * *